US011715625B2

(12) United States Patent
Toland et al.

(10) Patent No.: US 11,715,625 B2
(45) Date of Patent: Aug. 1, 2023

(54) SEMICONDUCTOR PROCESSING CHAMBER

(71) Applicant: Applied Materials, Inc., Santa Clara, CA (US)

(72) Inventors: Greg Toland, San Jose, CA (US); Kenneth D. Schatz, Los Altos, CA (US); Laksheswar Kalita, San Jose, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 16 days.

(21) Appl. No.: 17/017,495

(22) Filed: Sep. 10, 2020

(65) Prior Publication Data

US 2021/0082665 A1 Mar. 18, 2021

Related U.S. Application Data

(60) Provisional application No. 62/900,042, filed on Sep. 13, 2019.

(51) Int. Cl.
*H01J 37/32* (2006.01)
*H01L 21/67* (2006.01)

(52) U.S. Cl.
CPC .... *H01J 37/3244* (2013.01); *H01J 37/32183* (2013.01); *H01J 37/32495* (2013.01);
(Continued)

(58) Field of Classification Search
CPC ............. H01J 37/32715; H01J 37/3244; H01J 37/32183; H01J 37/32495;
(Continued)

(56) References Cited

U.S. PATENT DOCUMENTS

2009/0107403 A1 4/2009 Moshtagh et al.
2009/0178614 A1* 7/2009 Kasai .................. C23C 16/4557
118/723 R
(Continued)

FOREIGN PATENT DOCUMENTS

JP 2003524703 A 8/2003
JP 2012216823 A 11/2012
(Continued)

OTHER PUBLICATIONS

International Preliminary Report on Patentability dated Mar. 24, 2022 in International Patent Application No. PCT/US2020/049464, 5 pages.
(Continued)

*Primary Examiner* — Yuechuan Yu
(74) *Attorney, Agent, or Firm* — Kilpatrick Townsend & Stockton LLP

(57) ABSTRACT

Exemplary semiconductor processing systems may include a pedestal configured to support a semiconductor substrate. The pedestal may be operable as a first plasma-generating electrode. The systems may include a lid plate defining a radial volume. The systems may include a faceplate supported with the lid plate. The faceplate may be operable as a second plasma-generating electrode. A plasma processing region may be defined between the pedestal and the faceplate within the radial volume defined by the faceplate. The faceplate may define a plurality of first apertures. The systems may include a showerhead positioned between the faceplate and the pedestal. The showerhead may define a plurality of second apertures comprising a greater number of apertures than the plurality of first apertures.

18 Claims, 9 Drawing Sheets

(52) U.S. Cl.
CPC .. *H01J 37/32522* (2013.01); *H01J 37/32715* (2013.01); *H01L 21/67069* (2013.01); *H01J 2237/332* (2013.01); *H01J 2237/334* (2013.01)

(58) Field of Classification Search
CPC ........... H01J 37/32522; H01J 2237/334; H01J 2237/332; H01L 21/67069
See application file for complete search history.

(56) References Cited

U.S. PATENT DOCUMENTS

| | | |
|---|---|---|
| 2009/0236041 A1 | 9/2009 | Ilzuka |
| 2011/0011730 A1 | 1/2011 | Valcore, Jr. et al. |
| 2011/0088847 A1 | 4/2011 | Law et al. |
| 2014/0283746 A1* | 9/2014 | Seo ....................... C23C 16/513 118/723 R |
| 2018/0337024 A1* | 11/2018 | Tan ................... C23C 16/45565 |
| 2018/0337057 A1* | 11/2018 | Samir ................... C23C 16/455 |

FOREIGN PATENT DOCUMENTS

| | | |
|---|---|---|
| JP | 2019517141 A | 6/2019 |
| WO | 2004-015165 A1 | 2/2004 |

OTHER PUBLICATIONS

International Search Report and Written Opinion dated Dec. 21, 2020 in International Patent Application No. PCT/US2020/049464, 10 pages.

\* cited by examiner

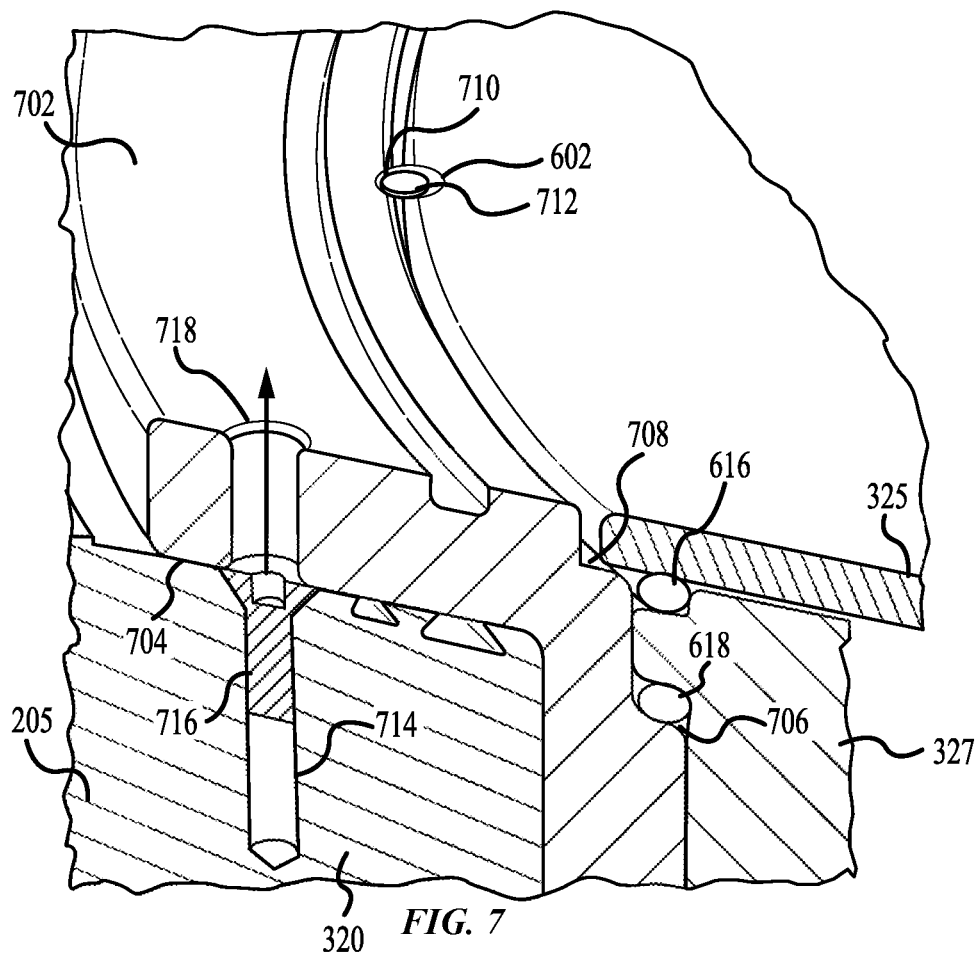
FIG. 7
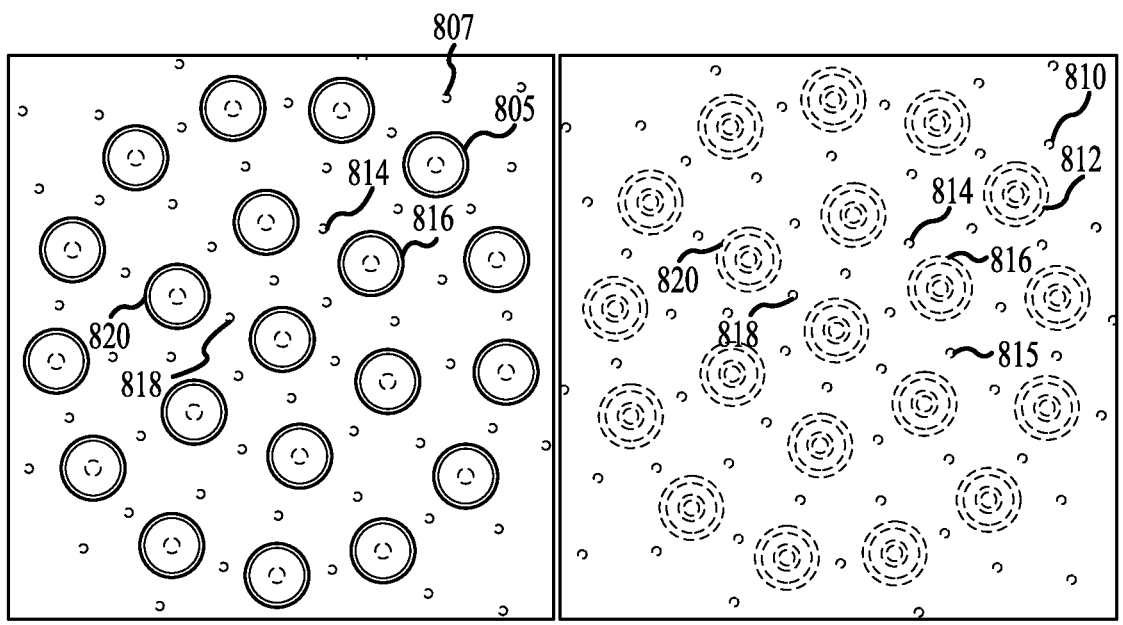
FIG. 8A                    FIG. 8B

SEMICONDUCTOR PROCESSING CHAMBER

CROSS-REFERENCE TO RELATED APPLICATIONS

This application claims the benefit of, and priority to U.S. Provisional Patent Application No. 62/900,042, filed 13 Sep. 2019, the contents of which are hereby incorporated by reference in their entirety for all purposes.

TECHNICAL FIELD

The present technology relates to semiconductor systems, processes, and equipment. More specifically, the present technology relates to semiconductor processing systems and components.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etch processes may penetrate into intricate features and trenches, but may not provide acceptable top-to-bottom profiles. As device sizes continue to shrink in next-generation devices, the ways in which systems deliver precursors into and through a chamber may have an increasing impact. As uniformity of processing conditions continues to increase in importance, chamber designs and system set-ups may have an important role in the quality of devices produced.

Thus, there is a need for improved systems and methods that can be used to produce high quality devices and structures. These and other needs are addressed by the present technology.

SUMMARY

Exemplary semiconductor processing systems may include a pedestal configured to support a semiconductor substrate. The pedestal may be operable as a first plasma-generating electrode. The systems may include a lid plate defining a radial volume. The systems may include a faceplate supported with the lid plate. The faceplate may be operable as a second plasma-generating electrode. A plasma processing region may be defined between the pedestal and the faceplate within the radial volume defined by the faceplate. The faceplate may define a plurality of first apertures. The systems may include a showerhead positioned between the faceplate and the pedestal. The showerhead may define a plurality of second apertures comprising a greater number of apertures than the plurality of first apertures.

In some embodiments, the showerhead may be or include a dielectric material. The showerhead may define at least twice as many apertures as the faceplate. Each aperture of the plurality of second apertures may be offset from each aperture of the plurality of first apertures. A first subset of apertures of the plurality of second apertures may be characterized by a similar aperture pattern as the plurality of first apertures. Each aperture of the first subset of apertures may be offset from an associated aperture of the plurality of first apertures along an angle from a central axis through the showerhead. The first subset of apertures of the plurality of second apertures may include a similar number of apertures as a number of apertures in the plurality of first apertures.

A second subset of apertures of the plurality of second apertures may be characterized by a similar aperture pattern as the plurality of first apertures. Each aperture of the second subset of apertures may be offset from an associated aperture of the plurality of first apertures along a radius from a central axis through the showerhead. The second subset of apertures of the plurality of second apertures may be or include a similar number of apertures as a number of apertures in the plurality of first apertures. The processing system may also include an annular liner positioned within the radial volume defined by the lid plate. The annular liner may be characterized by a first surface facing the showerhead and a second surface opposite the first surface. The annular liner may define a protrusion extending about an exterior surface of the annular liner. The protrusion may be recessed from the first surface of the annular liner and may define a first ledge facing the first surface of the annular liner and a second ledge facing the second surface of the annular liner. The processing system may further include a first elastomeric element extending about the first ledge, and a second elastomeric element extending about the second ledge.

The first elastomeric element may extend proud of the first surface of the annular liner. The showerhead may be seated on the first elastomeric element. The processing system may also include a spacer seated on the lid plate, and the spacer may define a first recessed ledge. The second elastomeric element may be seated on the first recessed ledge of the spacer. The spacer may define a second recessed ledge radially outward of the first recessed ledge. The showerhead may define a plurality of notches about an exterior edge of the showerhead. The semiconductor processing system further include a plurality of alignment pins. Each alignment pin of the plurality of alignment pins at least partially may be disposed within a notch of the plurality of notches. Each alignment pin of the plurality of alignment pins may be seated on the second recessed ledge of the spacer.

An exterior of the faceplate may be characterized by an oxide coating. The showerhead may be characterized by a first surface facing the faceplate. The plurality of second apertures may extend from the first surface of the showerhead to a second surface of the showerhead opposite the first surface of the showerhead. Each aperture of the plurality of second apertures may be characterized by a profile limiting a linear path through the aperture in a direction orthogonal to the second surface of the showerhead. The first surface of the showerhead may be disposed within 2 mm from the faceplate.

Some embodiments of the present technology may encompass semiconductor processing systems. The systems may include a lid plate at least partially defining a radial volume for plasma processing. The systems may include a spacer seated on the lid plate and at least partially extending within the radial volume. The spacer may be characterized by a first surface and a second surface opposite the first surface. The spacer may be seated on the lid plate along the second surface of the spacer. The systems may include a faceplate seated on the first surface of the spacer and at least partially defining the radial volume from above. The faceplate may define a plurality of first apertures. The systems may include a gasbox. The faceplate may be disposed between the gasbox and the spacer. The gasbox may define a central aperture, and the gasbox may define a first channel within a first surface of the gasbox.

In some embodiments, the systems may also include a heater extending through the first channel. The first channel may be characterized by a spiral profile within the first surface of the gasbox. The heater may extend within the first channel for an integral number of turns. The systems may include a cover plate extending across the first channel defined within the first surface of the gasbox. The gasbox may further define a second channel within the first surface of the gasbox radially inward of the first channel. The gasbox may define a third channel within the first surface of the gasbox radially outward of the first channel. The semiconductor processing systems may include a first gasket disposed within the second channel within the first surface of the gasbox. The systems may include a second gasket disposed within the third channel within the first surface of the gasbox. The cover plate may form a seal between the first gasket and the second gasket.

The gasbox may be characterized by a second surface opposite the first surface, and the central aperture may flare at the second surface of the gasbox. The gasbox may define a recessed ledge from the first surface of the gasbox extending into the central aperture. The systems may include an insert seated on the recessed ledge within the central aperture. The insert may define one or more apertures providing access through the central aperture of the gasbox. The lid plate may define at least one aperture at least partially extending through the lid plate from a first surface of the lid plate on which the spacer is seated. The spacer may define at least one aperture, each aperture of the at least one aperture of the spacer axially aligned with an associated aperture of the at least one aperture of the lid plate. Each aperture of the at least one aperture of the spacer may be characterized by a diameter less than a diameter of the associated aperture of the at least one aperture of the lid plate at the first surface of the lid plate. The systems may include a jack member disposed within each aperture of the at least one aperture of the lid plate. A surface of each jack member may be characterized by a diameter greater than a diameter of each aperture of the at least one aperture of the spacer, and removal of the jack member may be configured to separate the spacer from the lid plate.

Some embodiments of the present technology may also encompass semiconductor processing systems. The systems may include a lid plate defining a first radial volume and a second radial volume laterally separated along the lid plate from the first radial volume. The systems may include a first lid stack seated on the lid plate and axially aligned with the first radial volume. The systems may include a first RF match, where the first lid stack may be disposed between the lid plate and the first RF match. The systems may include a second lid stack seated on the lid plate and axially aligned with the second radial volume. The systems may include a second RF match, where the second lid stack may be disposed between the lid plate and the second RF match.

In some embodiments, one or more components of the first lid stack and one or more components of the second lid stack may include an oxide coating. The first lid stack may include a first gasbox defining a central aperture. The second lid stack may include a second gasbox defining a central aperture. The systems may include a first outlet manifold positioned on the first gasbox along a first surface of the first outlet manifold. The first outlet manifold may define a central aperture extending partially through the first outlet manifold from the first surface of the first outlet manifold towards a second surface of the first outlet manifold opposite the first surface of the first outlet manifold. The central aperture of the first outlet manifold may provide fluid access to the central aperture of the first gasbox. The systems may include a first conductive pin electrically coupling the first RF match with the first outlet manifold.

The systems may include a second outlet manifold positioned on the second gasbox along a first surface of the second outlet manifold. The second outlet manifold may define a central aperture extending partially through the second outlet manifold from the first surface of the second outlet manifold towards a second surface of the second outlet manifold opposite the first surface of the first outlet manifold. The central aperture of the second outlet manifold may provide fluid access to the central aperture of the second gasbox. The systems may include a second conductive pin electrically coupling the second RF match with the second outlet manifold. The first gasbox and the second gasbox may each define a first channel within a first surface of a respective gasbox on which a respective outlet manifold is positioned. Each first channel may be characterized by a spiral profile within the first surface of the respective gasbox.

The systems may include a first heater extending through the first channel of the first gasbox, and a first RF filter may be coupled with the first heater. The systems may include a second heater extending through the first channel of the second gasbox, and a second RF filter may be coupled with the second heater. The systems may include a first gas block coupled with an exterior edge of the first outlet manifold. The first gas block may be coupled to provide fluid communication to the central aperture of the first outlet manifold. The systems may include a second gas block coupled with an exterior edge of the second outlet manifold. The second gas block may be coupled to provide fluid communication to the central aperture of the second outlet manifold. The systems may include a gas feedthrough extending through the lid plate and coupled with each of the first gas block and the second gas block. The semiconductor processing system may include two gas feedthroughs extending through the lid plate and coupled with each of the first gas block and the second gas block. The lid plate may define an aperture through which the gas feedthrough extends. The lid plate may be hingedly coupled with a chamber body of the semiconductor processing system. The chamber body may include an elastomeric element on which the gas feedthrough seats when the lid plate is closed upon the chamber body.

Such technology may provide numerous benefits over conventional systems and techniques. For example, the systems may protect against corrosion better than conventional designs. Additionally, the symmetric electrical designs may improve RF uniformity, which may improve plasma uniformity. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIG. 7 shows a schematic partial cross-sectional view of components according to some embodiments of the present technology.

FIGS. 8A-8B show schematic plan views of components with projections according to some embodiments of the present technology.

Figure 1:
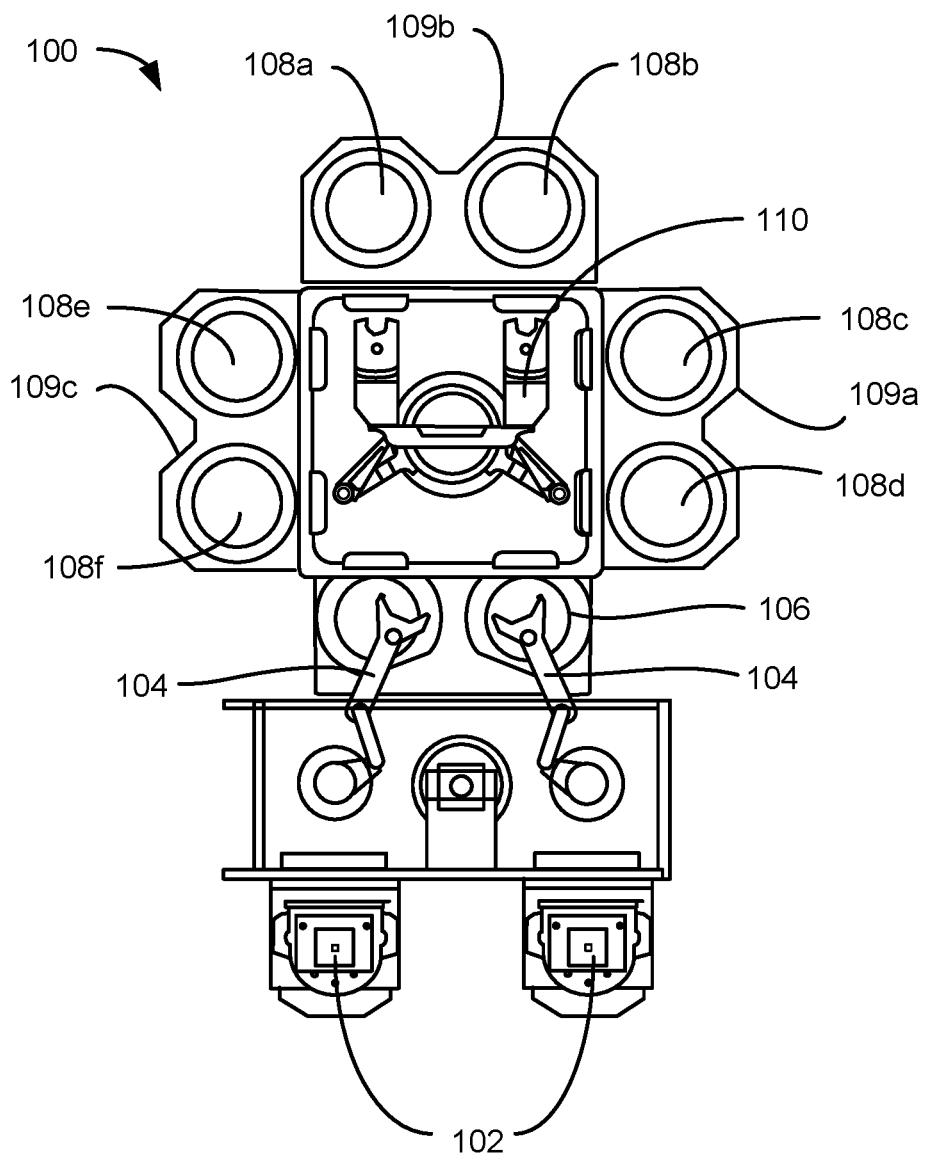
FIG. 1 shows a schematic top plan view of an exemplary processing mainframe according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes semiconductor processing systems, chambers, and components for performing semiconductor fabrication operations. Many dry etch operations performed during semiconductor fabrication may involve multiple precursors. When energized and combined in various ways, these etchants may be delivered to a substrate to remove or modify aspects of a substrate. Traditional processing systems may provide precursors, such as for etching, in multiple ways. One way of providing enhanced precursors or etchants is to provide all of the precursors through a remote plasma unit before delivering the precursors through a processing chamber and to a substrate, such as a wafer, for processing. An issue with this process, however, is that the different precursors may be reactive with different materials, which may cause damage to the remote plasma unit or any components that may be contacted by the radical effluents. For example, an enhanced fluorine-containing precursor may react with aluminum surfaces, but may not react with oxide surfaces. An enhanced hydrogen-containing precursor may not react with an aluminum surface, but may react with and remove an oxide coating. Thus, if the two precursors are delivered through a remote plasma unit together, they may damage any number of components.

The present technology may overcome these issues by utilizing components and systems configured to mix the precursors prior to delivering them into the chamber, where local plasmas may be generated to produce etchants. Chambers and systems according to some embodiments of the present technology may also include component configurations that maximize thermal conductivity through the chamber, and increase ease of servicing by coupling the components in specific ways. Several of the system components may also be coated or otherwise protected to limit reactivity and damage during fluid delivery through the chamber.

Although the remaining disclosure will routinely identify specific etching processes utilizing the disclosed technology, it will be readily understood that the systems and methods are equally applicable to deposition and/or cleaning processes as may occur in the described chambers. Accordingly, the technology should not be considered to be so limited as for use with etching processes alone.

FIG. 1 shows a top plan view of one embodiment of a processing system 100 of deposition, etching, baking, and/or curing chambers according to some embodiments. In the figure, a pair of front opening unified pods 102 may supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, degas, orientation, and other substrate processes.

The substrate processing chambers 108a-f may include one or more system components for depositing, annealing, curing and/or etching a dielectric, metal, or semiconductor film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited material. In another configuration, all three pairs of chambers, e.g., 108a-f, may be configured to etch a dielectric, metal, or semiconductor material on the substrate. Any of the tandem sections may be outfitted with processing systems described below. It will be appreciated that additional configurations of deposition, etching, annealing, and curing chambers for dielectric films are similarly encompassed by system 100.

Figure 2:
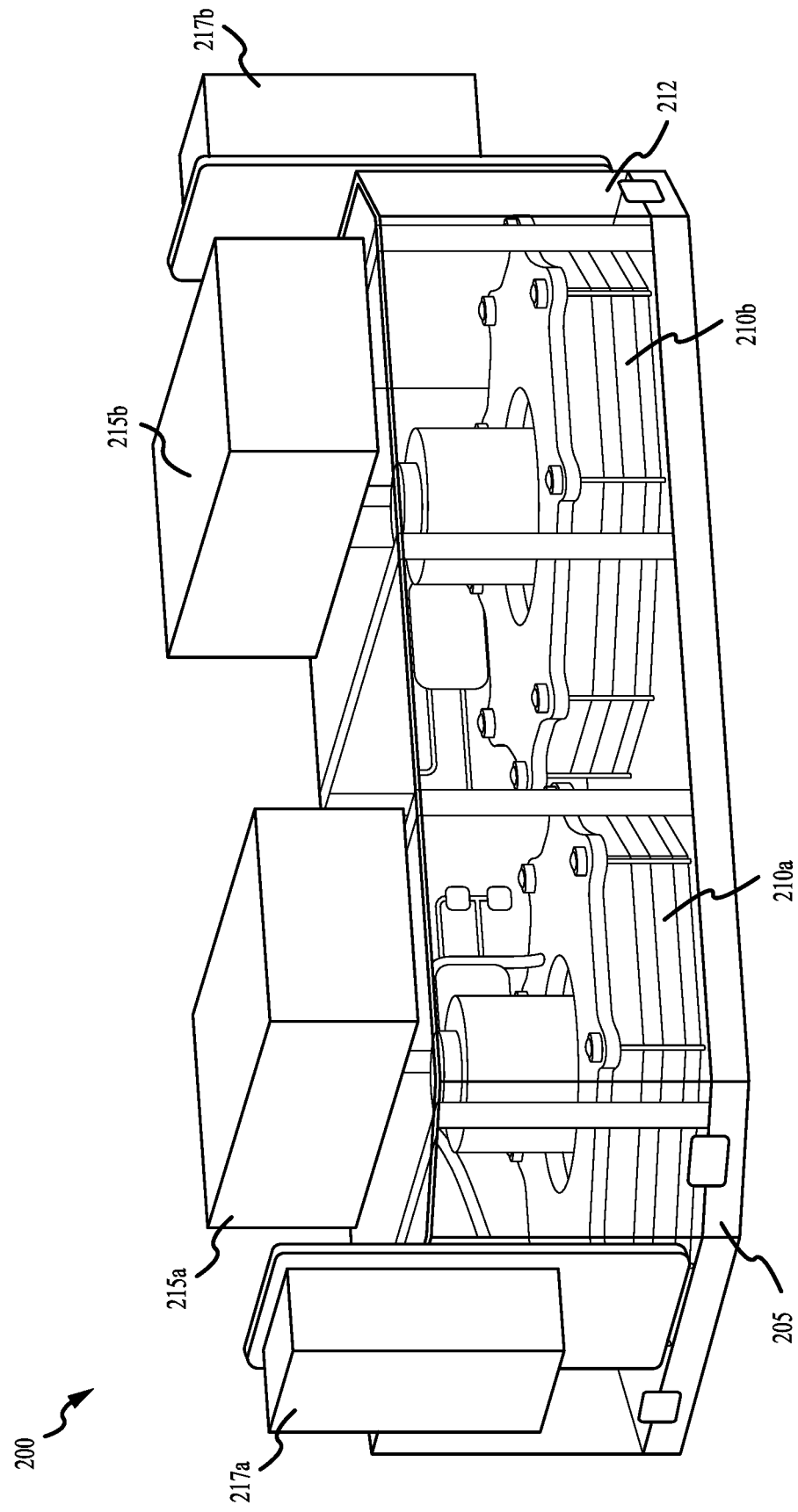
FIG. 2 shows a schematic isometric view of an exemplary semiconductor processing system according to some embodiments of the present technology.

FIG. 2 shows a schematic cross-sectional view of an exemplary semiconductor processing system 200 according to some embodiments of the present technology. System 200 may be incorporated onto the mainframe illustrated in FIG. 1, and may include some or all of the components illustrated in that figure. The image may include a partial view of a lid plate and lid stack, as well as associated components, but may include additional components as will be explained further below. System 200 may include a pair of adjacent processing chambers, or tandem processing chamber, which may include similar components to one another, and may share certain components of the system. The system may include a lid plate 205, which may support lid stacks 210a and 210b for the separate chambers. As will be described further below, lid plate 205 may define two radial volumes in some embodiments, and the lid stacks may each be aligned or coaxial with one of the radial volumes. For example, lid stack 210a may be coaxial with a first radial volume defined by lid plate 205, and lid stack 210b may be coaxial with a second radial volume defined by lid plate 205. A box cover 212, shown transparently to illustrate covered components, may provide RF sealing, and may at least partially house the lid stacks 210.

The box cover 212 may also support additional components that may be described in more detail below. For example, each chamber of the system may include an individual RF match 215 aligned with a chamber. For example, first RF match 215a may be axially aligned or coaxial with a central axis of lid stack 210a, or the first processing chamber, and the lid stack 210a may be disposed between the lid plate 205 and the first RF match 215a. Similarly, second RF match 215b may be axially aligned or coaxial with a central axis of lid stack 210b, or the second processing chamber of the system 200, and the lid stack 210b may be disposed between the lid plate 205 and the second RF match 215b. Box cover 212 may also support additional components, such as a separate RF filter 217 for each chamber. For example, each chamber may incorporate a heater that may interfere with the electrical signal for plasma processing. The heater may be operated via an RF filter as illustrated, and as will be described further below, to improve losses and interference with the plasma generation system. As illustrated, a first RF filter 217a may be coupled with the box cover, and coupled with a heater of the lid stack 210a. A second RF filter 217b may be coupled with the box cover, such as on an opposite end as illustrated, for example, and may be coupled with a heater of the lid stack 210b. By utilizing coaxial RF match setups as will be described further below, improved RF delivery, reduced losses, and improved plasma uniformity may be produced by systems according to embodiments of the present technology.

Figure 3:
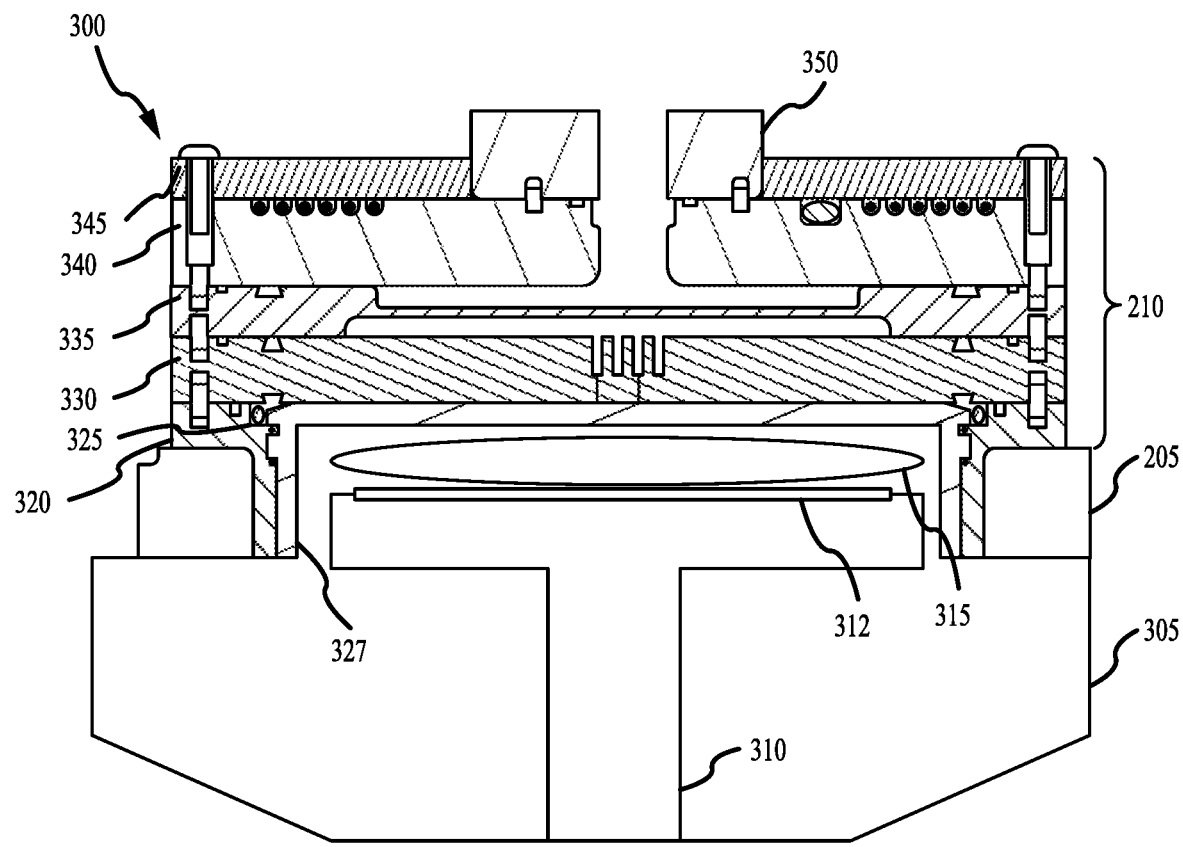
FIG. 3 shows a schematic partial cross-sectional view of an exemplary processing chamber according to some embodiments of the present technology.

FIG. 3 shows a schematic partial cross-sectional view of an exemplary processing chamber 300 according to some embodiments of the present technology. For example, the figure may illustrate one half of the system 200 described above, and may illustrate the associated components of one chamber of the system. For example, processing chamber 300 may include lid plate 205, or what may be about half of the lid plate associated with one processing chamber, as well as one lid stack 210 disposed on the lid plate 205. Lid plate 205 may be coupled with chamber body 305, which may provide access to a pumping or exhaust system for extracting excess precursors or byproducts of processes performed. The chamber 300 may also include a pedestal 310 or other substrate support, which may be configured to support a semiconductor substrate 312.

As noted above, processing system 200, or each individual chamber 300 may be configured to perform plasma processing in embodiments of the present technology. For example, etch processes utilizing one or more halogen precursors, such as chlorine-containing or fluorine-containing precursors, may be delivered with one or more other reactive, neutral, or carrier precursors into a processing region 315. A plasma may be generated in some embodiments within the processing region 315, such as a capacitively-coupled plasma, which may produce radical effluents that react and etch materials on substrate 312. The pedestal may operate as one of two plasma-generating electrodes in embodiments. One or more components of the lid stack may operate as a second plasma-generating electrode in embodiments. Although either the pedestal or the lid stack components may operate as the hot electrode, in some embodiments, a component of the lid stack may operate as the hot electrode, such as in electrical communication with the RF match, while the pedestal may be grounded.

When the pedestal may be operated as RF hot, the field strength near the chamber wall and at the edge of the electrode may be relatively high, which may increase plasma strength at the edges. This may increase an edge etch rate on the substrate, which may decrease uniformity of etching. When the polarity is reversed, and the lid stack operates as the RF hot electrode, increased field strength near the chamber wall may still produce increased radical effluents, but due to the relative distance from the substrate, these increased radicals may not impact the substrate as readily. This may increase uniformity of etching at the substrate, which may improve processing across a substrate.

Chamber 300 may include a number of components coupled to produce lid stack 210. The lid stack may include one or more of a lid spacer 320, a showerhead 325, a liner 327, a faceplate 330, a blocker plate 335, a gasbox 340, a cover plate 345, and an outlet manifold 350. The components may be utilized to distribute a precursor or set of precursors through the chamber to provide a uniform delivery of etchants or other precursors to a substrate for processing, and/or may be used to protect chamber components as will be described below. In some embodiments, some of these components may be stacked plates each at least partially defining an exterior of chamber 300.

As explained previously, chambers and components according to some embodiments of the present technology may be used to perform operations in which a bias plasma may be formed in processing region 315. This operation may include aspects of etching including a physical bombardment of structures on a substrate, as well as a reactive etch performed by reactive plasma effluents produced in processing region 315. The precursors may include halogen precursors, which may be configured to remove material from a substrate. Accordingly, components of the chamber may be exposed to both chemically reactive plasma effluents, such as fluorine, chlorine, or other halogen-containing effluents, as well as ions produced in the plasma, which may physically impact materials and components.

Systems and chambers according to embodiments of the present technology may also include configurations and coatings to limit plasma interaction with components. For example, faceplate 330, which may be an additional showerhead, may conventionally have been exposed to both plasma effluents, such as bias plasma effluents contacting the surface facing the substrate and within apertures, as well as reactive effluents proceeding through apertures of the faceplate before interacting with substrate 312. Other components noted above may also be exposed to one or both plasma effluents, including from backstreaming plasma effluents.

The plasma effluents may produce differing effects on the chamber components. For example, ions may be at least partially filtered from backstreaming by showerhead 325 from the chemically reactive plasma effluents produced in processing region 315. However, the reactive effluents, such as chlorine-containing effluents, for example, may cause corrosion of exposed materials, such as by forming aluminum chloride. Over time, this process may corrode exposed metallic components, requiring replacement. Additionally, plasma species formed from a plasma in processing region 315 may have conventionally impacted components causing physical damage and sputtering that may erode components over time. Accordingly, any of the described components may have been susceptible to chemical corrosion as well as physical erosion from plasma effluents produced within one or more regions of the chamber.

Corrosion may be controlled in some ways by forming a coating over materials. For example, while aluminum may corrode from exposure to chlorine-containing or fluorine-containing materials, aluminum oxide, or other platings or coatings, may not corrode on contact with the precursors. Accordingly, any of the described components may be coated or protected by anodization, oxidation, electroless nickel plating, aluminum oxide deposited coatings, barium titanate, or any other material that may protect exposed conductive materials, such as aluminum, from chemical corrosion. Similarly, erosion may be controlled in some ways by forming a coating over materials. For example, high performance materials such as e-beam or plasma spray yttrium oxide, which may or may not include additional materials including aluminum or zirconium, for example, may protect the component from physical damage caused by plasma effluents. Damage to components may still occur, however, when a structure may be contacted by both corrosive plasma effluents as well as erosive plasma effluents.

Because chamber 300 may be configured to deliver halogen-containing precursors through each of the lid stack components, any one or more of these components may be coated or protected with any of the corrosion-resistant materials noted above. By limiting plasma generation to the processing region 315, fewer components may include erosion-resistant coatings. Additionally, chamber 300 may include showerhead 325, which may be or include a dielectric material, such as quartz, for example, and which may protect faceplate 330 from erosion due to ion bombardment. As will be explained below, apertures through the components may be configured together to limit or prevent interaction between plasma effluents and the faceplate 330.

Figure 4:
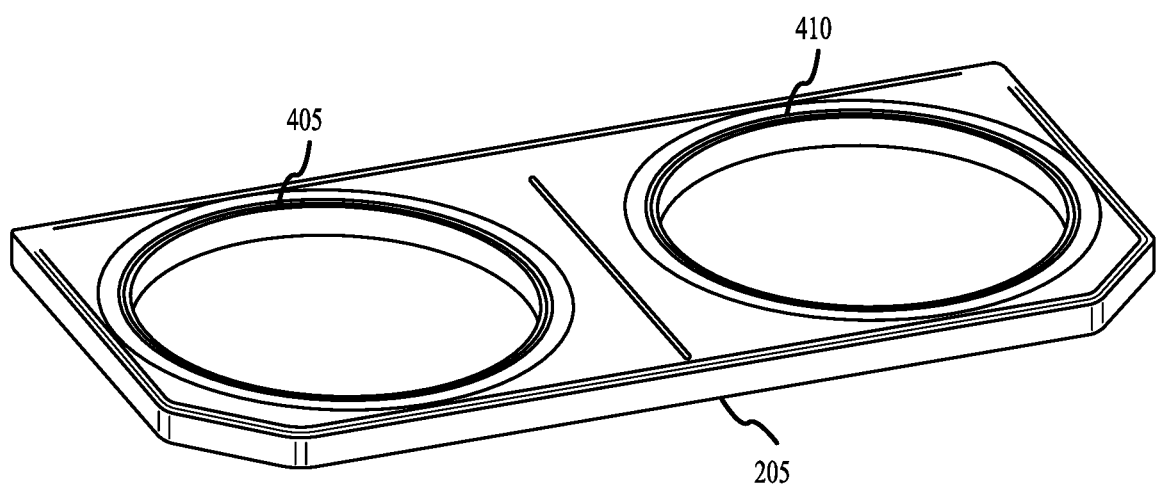
FIG. 4 shows a schematic isometric view of an exemplary lid plate according to some embodiments of the present technology.

FIG. 4 shows a schematic isometric view of an exemplary lid plate 205 according to some embodiments of the present technology. Lid plate 205 may provide a support structure for lid stacks as previously explained. As illustrated, lid plate 205 may provide a partially or substantially planar component defining a first radial volume 405 and a second radial volume 410, which may be laterally offset or separated from the first radial volume 405. As illustrated above, the radial volume may at least partially define the plasma processing region radially, along with faceplate 330 and/or showerhead 325 from above, and pedestal 310 or a substrate support from below.

Lid plate 205 may support one or more of the components of the lid stack as noted above, and may support each of the tandem lid stacks as well as the RF matches and associated components. Lid plate 205 may be aluminum in some embodiments, and may or may not include any of the corrosion or erosion-resistant coatings described above. For example, in some embodiments, lid plate 205 may be configured or include components configured to limit or prevent fluid or material contact with the lid plate during processing operations. Consequently, lid plate 205 may not include coatings in some embodiments. This may be advantageous in some configurations as coating a single-piece lid plate that may be almost a meter in length or more, may be impractical or impossible for some coating systems.

Figure 5:
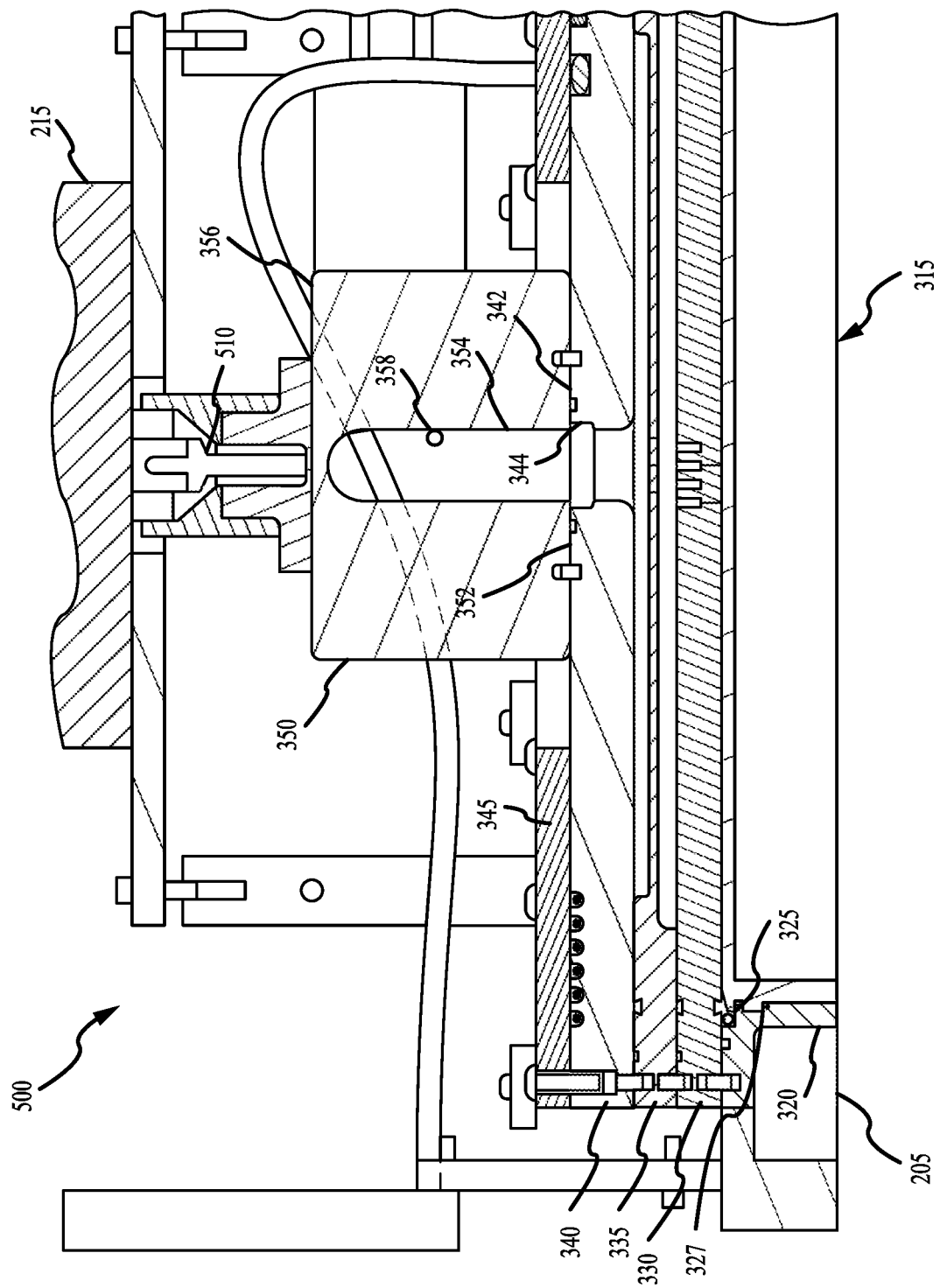
FIG. 5 shows a schematic partial cross-sectional view of an exemplary lid stack according to some embodiments of the present technology.

FIG. 5 shows a schematic partial cross-sectional view of an exemplary lid stack 500 according to some embodiments of the present technology. The figure may illustrate an enhanced view of components identified in any of the previous figures, and may include any of the components, materials, or characteristics as previously described. The figure may show components of a portion of one of the processing chambers that may be supported on lid plate 205, and it is to be understood that a second lid stack or processing chamber may include any or all of the components illustrated as a second version of the component described, as well as in different configurations, such as rotated, for example. For example, lid stack 500 may illustrate a portion of lid plate 205, which may support the components. The supported components may include lid spacer 320, liner 327, showerhead 325, faceplate 330, blocker plate 335, gasbox 340, and cover plate 345. As noted above, these may each be first components in some embodiments, with a second set of each of these components, as well as any other described elsewhere, incorporated as a second lid stack on lid plate 205. Some or all of these components may be coupled together, such as with bolts, fasteners, screws, or other elements that may compressibly join the components, which may increase heat transfer through the lid stack as will be described below. The components may also include outlet manifold 350, which may receive precursors as will be described further below.

The processing system may further include a power supply and/or RF match 215 electrically coupled with the processing chamber to provide electric power to the faceplate 330, to generate a plasma in the processing region 315 as previously described. Each component of the lid stack may include an RF gasket or other electrical coupling component disposed between successive plates to maintain proper electrical coupling for the RF path. Several of the figures illustrate one or more channels formed in one or more surfaces of each component, which may be used to seat an RF gasket as well as elastomeric elements, such as o-rings, to provide a seal between adjacent system components. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma processing region 315. This in turn may allow development of particular plasma characteristics such that precursors may be dissociated in specific ways to enhance the etching profiles produced by these precursors.

In some embodiments, the plasma formed in substrate processing region 315 may be used to produce the radical precursors from an inflow of, for example, a chlorine-containing precursor or other precursor. An AC voltage typically in the RF range may be applied between the conductive top portion of the processing chamber, such as outlet manifold 350, and through the lid stack components to the faceplate 330 to ignite a plasma in processing region 315 during deposition. An RF power supply may generate a high RF frequency of 13.56 MHz but may also generate other frequencies alone or in combination with the 13.56 MHz frequency, as well as any other frequencies up to 60 MHz or higher. The RF match may be connected with the chamber via a conductive pin 510 providing voltage to the processing chamber. The conductive pin may reside in a dielectric insulator and pin guide coupled with a surface of the outlet manifold 350. As illustrated the RF match and conductive pin may be aligned with a central axis through the chamber or lid stack components, and may be coaxial in some embodiments, which may improve electrical delivery and produce more uniform plasma.

The outlet manifold 350 may be seated on a first surface 342 of gasbox 340, and may contact the first surface of gasbox 340 along a first surface 352 of the outlet manifold 350. Outlet manifold 350 may define a central aperture 354 extending partially through the outlet manifold from the first surface 352. The central aperture 354 may extend partially or mostly through the outlet manifold, while not extending to or through a second surface 356 of the outlet manifold opposite the first surface 352. Second surface 356 may be electrically coupled with the RF match 215, such as via conductive pin 510, and may be configured to distribute RF power through the lid stack components. Outlet manifold 350 may include one or more apertures 358 through a sidewall of the central aperture 354, which may provide fluid access to the central aperture from a radial or exterior edge of the outlet manifold as will be described below.

Central aperture 354 of outlet manifold 350 may provide fluid access to gasbox 340, and a central aperture 344 of the gasbox. Gasbox 340 may deliver fluids or precursors into a region defined by blocker plate 335. Blocker plate 335 may have a number of apertures defined through the component to spread the precursors more uniformly outward within the chamber. For example, blocker plate 335 may define a number of relatively smaller apertures, which may produce a pressure drop across the component and increase residence time of a precursor allowing more lateral or radial delivery before proceeding through the lid stack. The blocker plate 335 may deliver the precursors to faceplate 330, which may define a plurality of first apertures as will be described below. The faceplate 330 may deliver the precursors to showerhead 325, which may further distribute the precursors to processing region 315. In processing region 315, a plasma may be generated from the precursors, which may produce ions that may contact internal components of the chamber. To reduce the interaction of plasma effluents with surfaces of components, such as lid spacer 320, lid plate 205, and faceplate 330, a showerhead 325 and liner 327 may be included in some embodiments.

Lid spacer 320 may include a dielectric material, such as a ceramic material for example, which may electrically isolate the lid stack from the lid plate and/or chamber body to facilitate plasma generation in the processing volume described above. To protect lid spacer 320, which may extend into the radial volume defined by the lid plate, the lid spacer may support additional components. For example, lid spacer 320 may be characterized by a first surface and a second surface, and may be seated on the lid plate along the second surface of the spacer. As will be explained below, lid spacer 320 may support the showerhead 325 and liner 327 in some embodiments. Faceplate 330, as well as the overlying lid stack components, may be seated on the first surface of lid spacer 320, which may maintain electrical isolation of these components that may be operating as a plasma-generating electrode in some embodiments.

Figure 6:
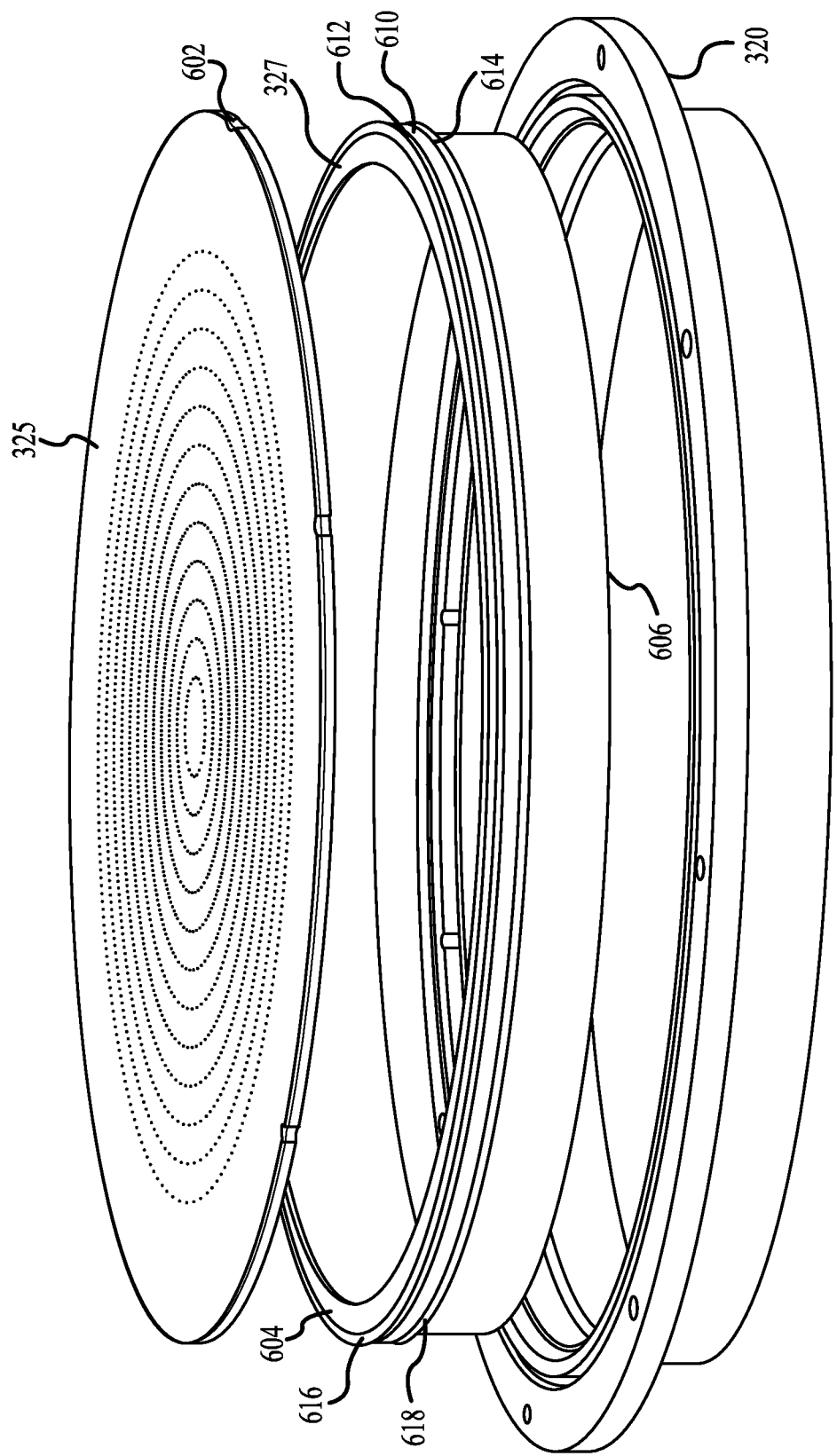
FIG. 6 shows a schematic exploded isometric view of lid stack components according to some embodiments of the present technology.

FIG. 6 shows a schematic exploded isometric view of lid stack components according to some embodiments of the present technology. The figure may include showerhead 325, liner 327, and lid spacer 320. As noted above, lid spacer 320 may support showerhead 325 and liner 327 to protect other chamber components from contact or impact by plasma effluent species. In some embodiments, showerhead 325 and liner 327 may be dielectric materials, such as quartz, for example, which may provide impact protection for the other lid stack and chamber components, as well as be resistant to corrosion from the etchant species generated. Because of the material properties of quartz, in some embodiments the showerhead 325 and the liner 327, may not directly contact other chamber components, and may be spaced and maintained indirectly coupled and seated within the lid stack.

Showerhead 325 may define a plurality of apertures, which may be second apertures as will be described below. Showerhead 325 may also define one or more notches 602 on or about a radial outer edge of showerhead 325. The notches 602 may be sized to accept an alignment pin as will be described below. Liner 327 may be an annular liner as illustrated, and may be characterized by a first surface 604 that may be facing showerhead 325. Liner 327 may also be characterized by a second surface 606 opposite the first, and which may extend within the processing region in a direction from the faceplate to the pedestal at least to or beyond an edge of the lid spacer 320. This may ensure protection of the lid spacer during processing operations.

As illustrated, liner 327 may define a protrusion 610 extending about an exterior surface of the annular liner. This protrusion may facilitate seating of both the liner and the showerhead in some embodiments. Protrusion 610 may be an integral portion of liner 327, which may be a monolithic or single-piece component. The protrusion 610 may be recessed from first surface 604 of liner 327. This may provide a first ledge 612, such as on a first surface of protrusion 610, facing the first surface of the annular liner, and a second ledge 614, such as on a second surface of protrusion 610 opposite the first surface, facing the second surface of the liner. In some embodiments a first elastomeric element 616 may be positioned on, and extend about, first ledge 612. A second elastomeric element 618 may be positioned on, and extend about, second ledge 614. The first elastomeric element 616 and the second elastomeric element 618 may or may not be pressure sealing components during processing within the chamber. The elastomeric elements may additionally or instead ensure the showerhead 325 and liner 327 may have limited contact with other components.

FIG. 7 shows a schematic partial cross-sectional view of components according to some embodiments of the present technology, and may show a detailed view of showerhead 325 and liner 327 incorporated within the lid stack. As illustrated, lid spacer 320 may include a first surface 702 and a second surface 704 opposite the first surface. The lid spacer 320 may seat on the lid plate 205 along the second surface 704, while the faceplate and other lid stack components may sit about the first surface 702 of the lid spacer. Lid spacer 320 may additionally define a portion extending vertically within the radial volume defined by the lid plate as previously described. The lid spacer 320 may define a first recessed ledge 706 along this portion. As previously described, showerhead 325 and liner 327 may be dielectric materials, such as quartz, in some embodiments. Quartz may crack when in contact with other components during processing conditions, and thus, in some embodiments the components may not directly contact other components of the lid stack.

As previously discussed, a first elastomeric element 616 and a second elastomeric element 618 may extend on surfaces of protrusion 610 and extend about the annular liner. The elastomeric elements may be bumper rings, for example, which may allow the liner and showerhead to be seated on other components. For example, liner 327 may rest on first recessed ledge 706 of lid spacer 320 along second elastomeric element 618. The first recessed ledge 706 may extend radially about the processing region volume, and may be in contact with the elastomeric element 618 along the ledge. In some embodiments a radially outer edge of liner 327 may contact lid spacer 320. In some embodiments, either or both of first elastomeric element 616 or second elastomeric element 618 may extend proud of protrusion 610, and may extend radially outward from a radially outer edge of the protrusion 610 to limit or prevent contact between the protrusion 610 and the lid spacer 320. First elastomeric element 616 may also extend proud of liner 327, and may extend vertically beyond a first surface 604 of liner 327. Accordingly, showerhead 325 may sit on first elastomeric element 616, and may have limited contact with liner 327, and in some embodiments may not contact liner 327.

Lid spacer 320 may also define a second recessed ledge 708 radially outward from first recessed ledge 706. Second recessed ledge 708 may recess from the first surface 702 of lid spacer 320, and first recessed ledge 706 may recess from the first surface 702 and the second recessed ledge 708. The extent of recess of first recessed ledge 706 from second recessed ledge 708 may be greater than a thickness of protrusion 610 of the liner 327, such as a distance between first ledge 612 and second ledge 614 of the protrusion. The extent of recess may, however, be less than a distance including a diameter of each elastomeric element. Consequently, an entire distance extending from second elastomeric element 618, protrusion 610, and first elastomeric element 616 may be greater than a distance of first recessed ledge 706 from second recessed ledge 708. This may allow showerhead 325 to be seated slightly above second recessed ledge 708, and may limit or prevent contact between a radial edge of showerhead 325 and an exposed surface of lid spacer 320. Second recessed ledge 708 may be characterized by a distance that is at least slightly greater than a thickness of showerhead 325.

As a faceplate as previously described may be seated on first surface 702 of lid spacer 320, a gap may be maintained between the faceplate and showerhead 325. To maintain the gap, second recessed ledge 708 may be characterized by a distance of recess from first surface 702 greater than a thickness of the showerhead 325 as well as a distance by which first elastomeric element 616 extends beyond second recessed ledge 708. Consequently, showerhead 325 may be maintained recessed below an uppermost portion of first surface 702 of lid spacer 320 on which a faceplate or lid stack components may be seated. This may then maintain a gap between the showerhead and the faceplate as will be described further below.

To limit movement of showerhead 325, and to maintain alignment during successive placements, showerhead 325 may define a plurality of notches 602 as previously described. Notches 602 may extend radially inward from an external radial edge of showerhead 325. A plurality of notches 710 may be formed along a radial sidewall at least partially defining second recessed ledge 708 of lid spacer 320, which may be companion notches for each notch 602 on the showerhead 325. Accordingly, in some embodiments the number of notches 602 and the number of notches 710 may be similar.

A plurality of alignment pins 712 may be seated in each of the notch sets to maintain alignment of the showerhead. Each alignment pin 712 may extend through a channel defined between each set of notch 602 and notch 710 about the showerhead. The alignment pins may be a material configured to limit damage to showerhead 325, and may be a polyimide material such as vespel, or may be teflon, PEEK, or some other material that may limit or prevent contact between the showerhead and any hard materials that might contribute to cracking or damage. The alignment pins 712 may be seated on second recessed ledge 708. Accordingly, although liner 327 may be contacted by elastomeric elements 616 and 618, and although showerhead 325 may be contacted by first elastomeric element 616 and/or alignment pins 712, the showerhead 325 and the liner 327 may be maintained separate from and may not contact lid spacer 320, an associated faceplate as previously described, lid plate 205, or any other component of the processing system in some embodiments.

During maintenance operations or tear down, the lid stack may be removed from the lid plate for accessing each lid stack plate for inspection or removal, such as for cleaning. Removal of the lid spacer 320, showerhead 325, and liner 327 may be performed with care to limit damage to potentially fragile components. As previously noted, lid spacer 320 may be a ceramic material, such as aluminum oxide, aluminum nitride, or any other ceramic or dielectric material. Forming threads, such as for screws or bolts or other jack members, may therefore be challenging without cracking or damaging the material. Accordingly, in some embodiments jack members may be incorporated with the lid plate to lift the lid spacer and from the lid plate.

As shown in FIG. 7, lid plate 205 may define one or more apertures 714 at least partially extending from a first surface of the lid plate on which the lid spacer 320 may be seated. The aperture or apertures 714 may at least partially extend through the lid plate 205 from the first surface, and in some embodiments may be threaded to support a jack member 716. The apertures 714 may be characterized by any profile, including a counterbore or countersink profile as illustrated, although straight apertures and other profiles are similarly encompassed. An associated aperture 718 may be defined through lid spacer 320, and may fully extend from first surface 702 through second surface 704 of the lid spacer. As lid spacer 320 may be ceramic in some embodiments, aperture or apertures 718 may not be threaded, and may contain no additional components within the aperture, although the apertures may provide at least partial access to aperture or apertures 714, as well as jack members 716. Each aperture 718 may be axially aligned with an associated aperture 714 and/or jack member 716 of the lid plate 205.

In some embodiments the apertures 718 of the spacer may be characterized by a diameter that may be less than or about the diameter of the apertures 714 through the lid plate 205. Apertures 718 and apertures 714 may be characterized by a number of profiles, although the diameter of aperture 718 at least at second surface 704 may be less than the diameter of apertures 714 at the first surface of lid plate 205. For example, a head or at least a surface of jack member 716 and an associated portion of aperture 714, such as is illustrated, may be characterized by a larger diameter than a diameter of apertures 718 at second surface 704 of lid spacer 320.

Consequently, jack members 716 may be accessed through apertures 718 of the lid spacer, and operation of the jack members, such as by rotation from a direction of threading of apertures 714, may draw the jack members from the apertures 714, which may lift or separate lid spacer 320 from the lid plate 205. As showerhead 325 and liner 327 may be seated on or with lid spacer 320, removal of the lid spacer may also remove these components.

Turning to FIGS. 8A-8B are shown schematic plan views of components with projections according to some embodiments of the present technology. FIG. 8A illustrates a top view of a portion of a faceplate according to some embodiments of the present technology. The faceplate may define a plurality of first apertures 805, which may be characterized by a number of profiles including a counterbore profile as shown, in which a diameter at a first surface, such as a surface facing a blocker plate or other lid stack component, may be larger than a diameter at a second surface opposite the first surface, such as a surface facing a showerhead or pedestal, or defining the processing region from above. Also shown is a projection of apertures 807, which may exist through a showerhead positioned proximate the second surface of the faceplate. The projection is included to illustrate that apertures through the showerhead may not overlap with apertures of the faceplate in some embodiments. Similarly, FIG. 8B illustrates a portion of a showerhead, such as a first surface, which may be facing a faceplate, and which may include any of the materials or characteristics of any showerhead described elsewhere. The showerhead may define a plurality of second apertures 810, which may be characterized by any number of profiles as will be described further below. In some embodiments, the plurality of second apertures 810 may include a greater number of apertures than the plurality of first apertures 805. Also shown is a projection of apertures 812, which may exist through a faceplate positioned proximate the first surface of the showerhead. Again, the projection may illustrate examples in which the apertures through the faceplate may not overlap or align with apertures of the showerhead in some embodiments.

The plurality of first apertures 805 of the faceplate may be characterized by a first pattern as shown. Any of a variety of patterns of first apertures may be similarly encompassed by the present technology including a different number of apertures per ring, different geometric patterns of apertures including more random patterns, or other aperture configurations. The plurality of second apertures 810 of the showerhead may be characterized by a second pattern as shown, which may also include any of a variety of aperture patterns. In some embodiments, the second pattern may be at least in part based on the first pattern.

For example, in some embodiments the second pattern may include one or more adjustments from the first pattern. The second pattern may include one, two, or more sets of apertures characterized by the first pattern, where each aperture of the plurality of second apertures may be offset from each aperture of the plurality of first apertures. As one non-limiting example, FIG. 8 illustrates aperture patterns in which the first pattern and number of apertures is incorporated twice to produce the second pattern of apertures, as two subsets of the plurality of second apertures, where the plurality of second apertures is twice the number of apertures as the plurality of first apertures. A first subset of the plurality of second apertures may be characterized by a pattern like the first aperture pattern that has been offset from the first pattern in a first way. Additionally, a second subset of the plurality of second apertures may be characterized by a pattern like the first aperture pattern that has been offset from the first pattern in a second way. Thus, the first subset of second apertures and the second subset of second apertures may each include the same number of apertures as the plurality of first apertures.

For example, the first subset of apertures of the plurality of second apertures may include the first aperture pattern after an angular offset. Thus, each aperture of the first subset of apertures of the plurality of second apertures may pair with an aperture of the first apertures, and be offset from that associated aperture along an angle in either direction from a central axis through the showerhead. In the illustrations, aperture 814, or alternatively aperture 815, on the showerhead and aperture 816 on the faceplate may be the same aperture of the two patterns, where the angular offset has been applied to the first subset of apertures of the plurality of second apertures that includes aperture 814. By applying this angular offset, the plurality of second apertures may include a first subset of apertures that may mimic the first pattern of apertures rotated an amount about a central axis through the components.

Similarly, the second subset of apertures of the plurality of second apertures may include the first apertures pattern after a radial offset. Thus, each aperture of the second subset of apertures of the plurality of second apertures may pair with an aperture of the first apertures, and be offset from that associated aperture along a radius in either direction from a central axis through the showerhead. In the illustrations, aperture 818 on the showerhead and aperture 820 on the faceplate may be the same aperture of the two patterns, where the radial offset has been applied to the second subset of apertures of the plurality of apertures that includes aperture 818. By applying this radial offset, the plurality of second apertures may include a second subset of apertures that may mimic the first pattern of apertures inward or outward an amount along corresponding radii from the central axis through the components.

Figure 9:
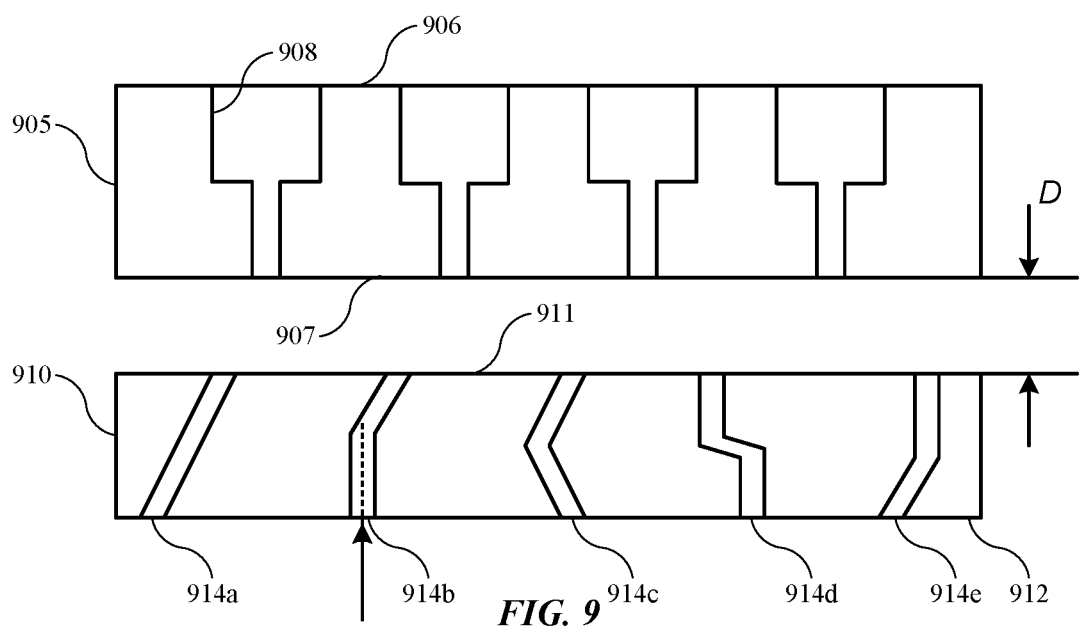
FIG. 9 shows a schematic partial cross-sectional view of components according to some embodiments of the present technology.

FIG. 9 shows a schematic partial cross-sectional view of components according to some embodiments of the present technology. The figure may provide a schematic representation of a faceplate 905 and a showerhead 910 according to some embodiments of the present technology. The faceplate 905 and showerhead 910 may be incorporated with a lid plate and lid stack as previously described. Faceplate 905 may include any of the features or characteristics of faceplates as described elsewhere. Additionally, showerhead 910 may include any of the features or characteristics of showerheads as described elsewhere.

The exemplary faceplate 905 includes a first pattern of first apertures 908 as discussed previously. The first apertures may be characterized by any number of profiles, including a counterbore as illustrated and extending from a first surface 906 to a second surface 907 of the faceplate. Showerhead 910 may include a number of different aperture patterns that may constitute a second pattern as discussed previously, and which may include a first subset and a second subset of apertures 914. As shown, showerhead 910 may define apertures 914 that are offset from some or all apertures 908 of faceplate 905. The apertures 914 may extend from first surface 911 to second surface 912, although the outlet of apertures 914 at second surface 912 may not align with an inlet of apertures 914 in some embodiments. In some embodiments, each aperture 914 may be offset from each aperture 908 of the faceplate, although the offset may occur at first surface 911 or second surface 912, as well as completely across the aperture from first surface 911 to second surface 912.

As discussed previously, showerhead 910 may be positioned within the processing region between faceplate 905 and a pedestal, which together may operate to generate plasma within the processing region. Showerhead 910 may be configured to limit ionic bombardment on the second surface 907 of faceplate 905, and may be or include a material, such as quartz, that may be more resistant to ionic bombardment. When plasma is produced, much ionic transmission may occur in a relatively linear direction parallel to a central axis through the chamber components. Consequently, by incorporating an aperture profile through showerhead 910 that may limit a linear path through the apertures 914 of the showerhead in a direction orthogonal to the second surface 912 of showerhead 910, ions are likely to impinge on a surface of the aperture, and may not pass through to first surface 911 of showerhead 910 or to the faceplate 905 disposed beyond.

Any number of aperture profiles may be utilized in embodiments of the present technology, and apertures 914a-914e may be only a few possible examples of aperture patterns encompassed by the present technology, and which may be selected or combined with other aperture profiles. For example, aperture 914a may be characterized by an angular path from first surface 911 to second surface 912, where the outlet at second surface 912 may be laterally offset from the inlet at first surface 911 to limit or prevent a linear path through the aperture. Apertures may be characterized by a number of angles, including angles extending in different directions through the showerhead or to different extents from other apertures, which may facilitate delivery into a processing region or improve uniformity.

Apertures 914b, and similar apertures 914e, may include a partially linear path through the aperture either from first surface 911 or to second surface 912, while incorporating a partially angled portion extending to one surface, which may similarly limit a direct linear path through the aperture. Again, the apertures may be combined amongst the plurality of second apertures, and may be characterized by angled portions extending in a variety of directions relative to other apertures. Aperture 914c may be characterized by a profile including two angled sections, which may or may not include an aligned inlet and outlet of the aperture as illustrated. However, the extent of the angle may be such that a direct linear path through the aperture may be limited or prevented. Aperture 914c may similarly be combined with any other aperture designs, and again may include multiple apertures having similar or different angled profiles from one another.

Aperture 914d may illustrate a more complex aperture profile in which two vertical portions extending from each of the first surface 911 and the second surface 912 may be offset laterally from one another, and joined with an angled portion of the aperture, which may be angled to limit or prevent a direct linear path through the aperture. Again, any number of different angles may be utilized among apertures through the showerhead, and any of the exemplary configurations may be used alone or in combination to produce an aperture pattern that may affect fluid flow in any number of ways, while limiting or preventing ion impingement on the second surface 907 of faceplate 905.

As discussed above, showerhead 910 may be spaced apart from faceplate 905 a distance D, which may occur from a configuration of an associated lid spacer and elastomeric elements, for example. The distance D may be minimized in some embodiments. For example, because in some embodiments faceplate 905 may be operated as a plasma-generating electrode to produce plasma in a processing region between the faceplate and the pedestal, plasma may be generated completely between the faceplate and the pedestal. However, if plasma may be generated between the showerhead and the faceplate, the showerhead will not prevent ionic bombardment on the second surface 907 of the faceplate. Additionally, contact between the showerhead and the faceplate may cause damage or fracture of the quartz showerhead.

Accordingly, in some embodiments a distance D between the showerhead and the faceplate may be limited to a distance to limit or prevent plasma generation between the components during operation, such as to control a mean-free path length before collision with the two components, which may prevent ionization. For example, in some embodiments, the showerhead 910 may be separated from the faceplate by 2 mm or less in order to prevent plasma generation, and may be separated from the faceplate by less than or about 1.8 mm, less than or about 1.6 mm, less than or about 1.4 mm, less than or about 1.2 mm, less than or about 1.0 mm, less than or about 0.9 mm, less than or about 0.8 mm, less than or about 0.7 mm, less than or about 0.6 mm, less than or about 0.5 mm, less than or about 0.4 mm, less than or about 0.3 mm, less than or about 0.2 mm, or less, although a gap may be maintained between the two components to limit or prevent physical contact between the components, and minimize a pressure drop within the gap between the two components.

Figure 10:
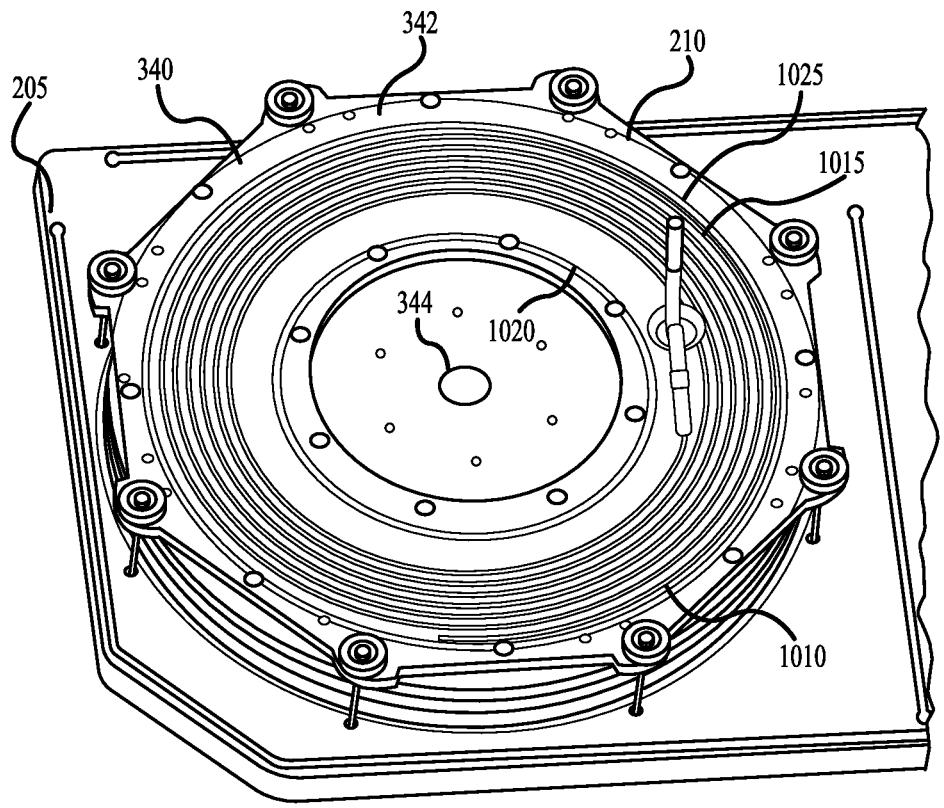
FIG. 10 shows a schematic a top isometric view of components according to some embodiments of the present technology.

Turning to FIG. 10 is shown a schematic a top isometric view of components according to some embodiments of the present technology. The figure may illustrate a portion of a lid plate 205 and a lid stack 210, which may be similar to lid stack 210a as discussed above. It is to be understood that the figure includes only a partial view, and the system may additionally include any of the components discussed elsewhere for semiconductor processing systems according to embodiments of the present technology. For example, lid plate 205 may define a second volume over which a second lid stack may be disposed, and which may include any component or any feature of any component described throughout the present disclosure, including with a variety of modifications, such as component rotation, for example.

The figure may illustrate a portion of a lid stack with the RF match and associated components removed, as well as with removal of the cover plate over the gasbox 340 shown. Beneath the gasbox 340 may be additional lid stack components including any of the components previously described. The figure may show a view of the first surface 342 of the gasbox including an inlet to central aperture 344 through the gasbox. Gasbox 340 may additionally define a first channel 1010 within the first surface of the gasbox. First channel 1010 may be characterized by a number of profiles, including a spiral or wound profile as illustrated. Disposed within the first channel 1010 may be a heater 1015. As illustrated, heater 1015 may extend through a cover plate and be wound within the first channel 1010. First channel 1010 may extend further than heater 1015, which may accommodate expansion of heater 1015 during operation.

Heater 1015 may be configured to heat lid stack 210 in embodiments, and may conductively heat each lid stack component. Heater 1015 may be any kind of heater including a cable heater, or other device configured to deliver heat conductively to gasbox 340, which may in turn heat each other lid stack component. In some embodiments, heater 1015 may be or include an electrical heater formed in a pattern defined by the first channel 1010 across the gasbox 340, and around central aperture 344 as well as an outlet manifold as previously described. The heater may be a resistive element heater that may be configured to provide up to, about, or greater than about 2,000 W of heat, and may be configured to provide greater than or about 2,500 W, greater than or about 3,000 W, greater than or about 3,500 W, greater than or about 4,000 W, greater than or about 4,500 W, greater than or about 5,000 W, or more.

Heater 1015 may be configured to produce a variable chamber component temperature up to, about, or greater than about 50° C., and may be configured to produce a chamber component temperature greater than or about 75° C., greater than or about 100° C., greater than or about 150° C., greater than or about 200° C., greater than or about 250° C., greater than or about 300° C., greater than or about 350° C., greater than or about 400° C., greater than or about 450° C., greater than or about 500° C., greater than or about 550° C., greater than or about 600° C., or higher in embodiments. Heater 1015 may be configured to raise individual components, such as the faceplate, to any of these temperatures to facilitate processing operations. In some processing operations, heater 1015 may be adjusted to conductively raise the temperature of the substrate to any particular temperature noted above, or within any range of temperatures within or between any of the stated temperatures. To maintain temperature uniformity across the gasbox 340, in some embodiments the heater may be wound within the first channel 1010 for an integral number of turns. For example, as illustrated, heater 1015 extends to a position on a radial outer turn that is substantially, or in some embodiments directly, in line with a position of the heater at the entrance or at an innermost radial turn. Accordingly, each area of the gasbox 340 is in contact with a similar area or amount of heater 1015, which may improve temperature uniformity in some embodiments. An inlet may be formed through an overlying cover plate, which may allow the heater to be electrically coupled with an associated RF filter, as illustrated previously, such as with FIG. 5.

Gasbox 340 may additionally define a second channel 1020 within first surface 342 of the gasbox. Second channel 1020 may be radially inward of first channel 1010 in some embodiments. Gasbox 340 may additionally define a third channel 1025 within first surface 342 of the gasbox. Third channel 1025 may be radially outward of first channel 1010 in some embodiments. While first channel 1010 may be incorporated to seat a heater as noted, second channel 1020 and third channel 1025 may be included to seal a cover plate about the gasbox.

Figure 11:
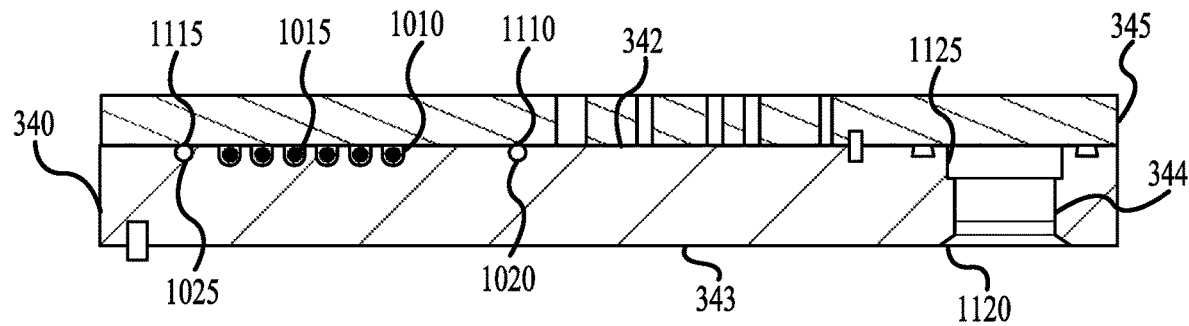
FIG. 11 shows a schematic partial cross-sectional view of components according to some embodiments of the present technology.

FIG. 11 shows a schematic partial cross-sectional view of components according to some embodiments of the present technology, and may illustrate a partial cross-section of a gasbox and cover plate according to some embodiments of the present technology. The figure is intended only to provide additional details of particular components, which may be incorporated in any chamber or system described elsewhere, and which may include any aspect of components or systems described elsewhere. As illustrated, gasbox 340 may be characterized by a first surface 342 and a second surface 343 opposite the first. Within first surface 342 may be defined a first channel 1010, within which heater 1015 may be disposed, as well as a second channel 1020, and a third channel 1025. As illustrated, in some embodiments second channel 1020 may be located radially inward of first channel 1010, and third channel 1025 may be located radially outward of first channel 1010.

A first gasket 1110 or elastomeric element may be disposed within second channel 1020, and a second gasket 1115 or elastomeric element may be disposed within the third channel 1025. Cover plate 345 may be seated at least partially across first surface 342 of gasbox 340, and may extend at least across first channel 1010, second channel 1020, and third channel 1025. Cover plate 345 may not extend fully radially inward, to provide access for an outlet manifold to be positioned on or in contact with the first surface 342 of the gasbox. The depth of first channel 1010 relative to the thickness of heater 1015 may be configured to reduce, limit, or prevent contact between heater 1015 and cover plate 345. Cover plate 345 may contact first gasket 1110 and second gasket 1115, and may form a seal between the two gaskets in some embodiments. By sealing across the first channel 1010, and the heater seated within the first channel 1010, cleaning operations may be performed less frequently of the first channel and the heater in some embodiments.

As noted above, gasbox 340 may be characterized by a first surface 342 and a second surface 343 opposite the first surface. A central aperture 344 may extend from first surface 342 to second surface 343, which may provide fluid access to the other lid stack components and into the processing region of the chamber. To facilitate fluid distribution, central aperture 344 may be characterized by a flare 1120 or bevel at an outlet of the central channel extending to second surface 343 of the gasbox. Additionally, gasbox 340 may define a recessed ledge 1125 from the first surface 342 into the central aperture 344. An insert may be seated on recessed ledge 1125 in some embodiments, which may be used to direct or adjust fluid flow into the processing chamber.

Figure 12A:
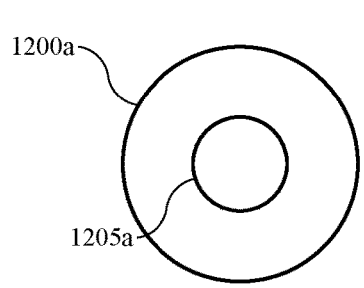
FIGS. 12A-12D show schematic views of exemplary distributer inserts according to some embodiments of the present technology.
Figure 12B:
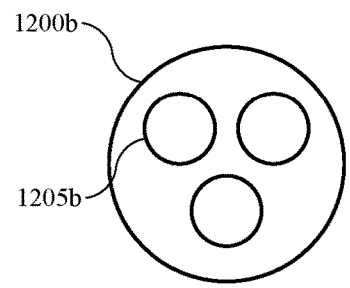

FIGS. 12A-12D show schematic views of exemplary distributer inserts 1200 according to some embodiments of the present technology. Inserts 1200 may be seated on recessed ledge 1125, and be used to increase mixing, or adjust fluid flow. For example, multiple precursors may be flowed into an outlet manifold overlying the gasbox. To increase mixing, an insert may reduce the aperture size or include multiple apertures providing access through the central aperture of the gasbox, which may facilitate mixing of the precursors as the precursors enter the processing chamber. For example, as illustrated in FIG. 12A, insert 1200a may include a single aperture 1205a, which may increase residence time and mixing prior to delivery through the gasbox. Similarly, as illustrated in FIG. 12B, insert 1200b may include multiple apertures 1205b, which may also affect residence time and flow. Any number of aperture configurations may be utilized in this way.

Figure 12C:
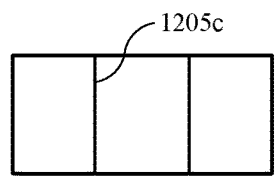
Figure 12D:
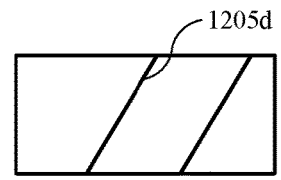

Additionally, apertures may extend through an insert in any number of ways to further adjust fluid flow or mixing. For example, as illustrated in FIG. 12C, one or more apertures 1205c, which may be associated with any aperture configuration including one or more apertures, may be characterized by a substantially vertical profile through the insert. Additionally, as illustrated in FIG. 12D, one or more apertures 1205d may be characterized by an angle extending through the insert, which may modify fluid flow, such as by causing an amount of swirl to precursors delivered into the processing chamber, which may further mix the materials. In embodiments the insert 1200 may be coated with any of the materials as previously described.

Figure 13:
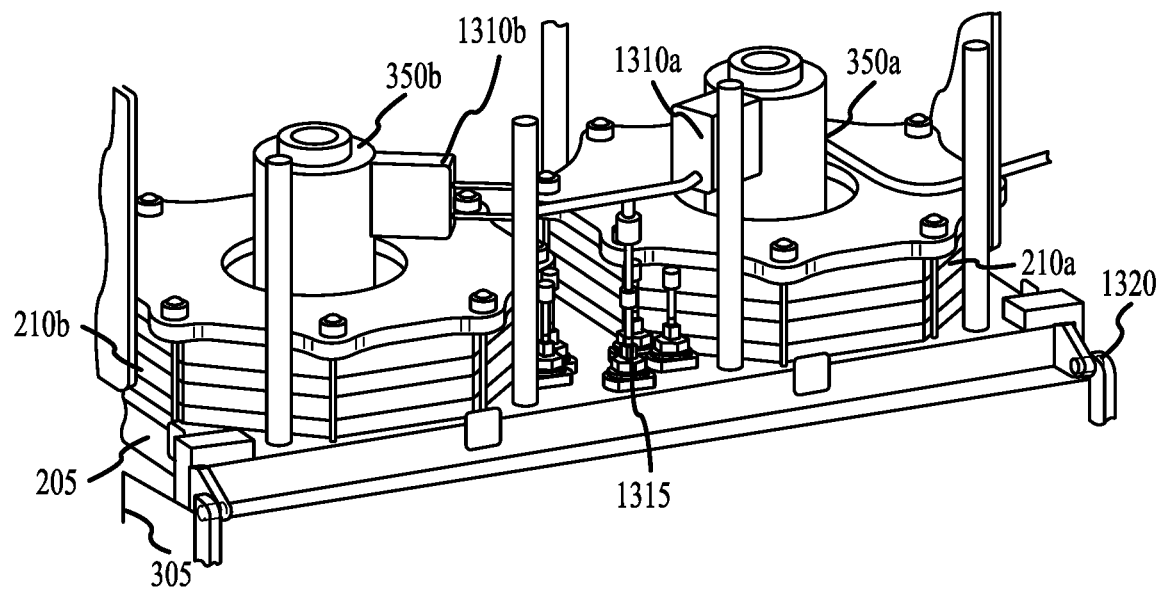
FIG. 13 shows a schematic partial isometric view of components according to some embodiments of the present technology.

FIG. 13 shows a schematic partial isometric view of components according to some embodiments of the present technology. The figure may show a partial reversed view of systems and components previously described, which may illustrate additional system details. FIG. 13 illustrates a semiconductor processing system 1300, which may include any component, characteristic, or material previously described. For example, system 1300 may include a lid plate 205, which may be coupled with a chamber body 305.

Chamber body 305 may include pedestals, which may be raised to engage a substrate within the processing region defined by lid stack components and the lid plate 205 as previously described. On lid plate 205 may be a first lid stack 210a and a second lid stack 210b, which may include any of the components and configurations described previously.

For example, lid stack 210a may include a first outlet manifold 350a, and lid stack 210b may include a second outlet manifold 350b, which may each be coupled with a respective RF match as previously described. As described above, outlet manifolds 350 may include a central aperture providing access to the respective lid stack through the gasbox, and may include one or more additional apertures extending to the central aperture from a radially exterior surface of the outlet manifold. In some embodiments, outlet manifold 350a and outlet manifold 350b may be similar or identical, although the components may be reversed from one another to provide access to the additional apertures from a central location on the lid plate 205. Precursors used in processing may be delivered through the lid plate 205, and may be piped and split to the two processing chambers or lid stacks.

Each outlet manifold may include a gas block coupling the associated precursor piping with each outlet manifold. For example, the system 1300 may include a first gas block 1310a coupled with an exterior edge of the first outlet manifold 350a. The first gas block may provide fluid communication with the central aperture of the outlet manifold through the additional one or more apertures extending laterally or radially from an exterior surface to the central aperture. System 1300 may also include a second gas block 1310b coupled with an exterior edge or surface of the second outlet manifold 350b. The second gas block may provide fluid communication with the central aperture of the outlet manifold through the additional one or more apertures extending laterally or radially from an exterior surface to the central aperture.

Although each outlet manifold 350 may be illustrated as being substantially cylindrical, a surface through which the additional apertures may be accessed, and with which gas block 1310 may be coupled, may be at least partially planarized or flattened to facilitate coupling of the components and limit leaks. The gas blocks may receive piping from one or more precursor sources, such as two precursor sources as illustrated. The precursors may be separately piped to the gas blocks, and may extend through the lid plate 205 with feedthroughs 1315, which will be described further below.

FIG. 13 additionally illustrates an aspect of coupling between the lid plate 205 and the chamber body 305 according to some embodiments of the present technology. For example, in some embodiments, lid plate 205, as well as the lid stacks, RF components, and associated piping supported by the lid plate 205, may be coupled with chamber body 305 about hinges 1320. Hinges 1320 may include leafs coupled with a first surface of lid plate 205, and may provide pins extending outward from the lid plate. Chamber body 305 may include knuckles, bearings, or receptacles that may receive the pins and may allow the lid plate to hinge about the chamber body, providing access to the interior of the processing region for substrate delivery and removal, inspection and cleaning, or other maintenance.

Figure 14:
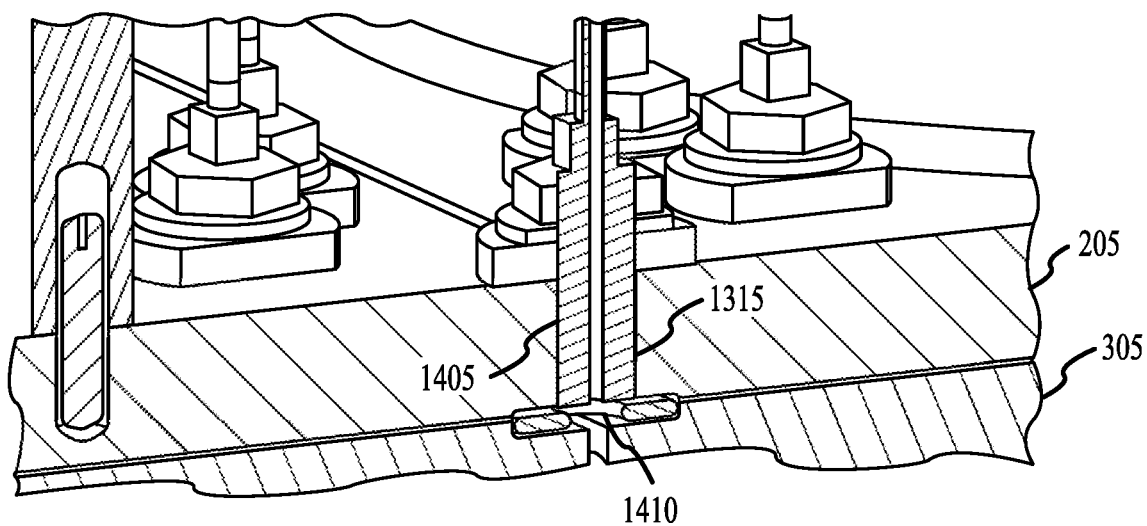
FIG. 14 shows a schematic partial cross-sectional view of components according to some embodiments of the present technology.

FIG. 14 shows a schematic partial cross-sectional view of components according to some embodiments of the present technology, and may illustrate a cross-section through lid plate 205 and through a feedthrough 1315 as previously described. Lid plate 205 may define one or more apertures through the lid plate, and through which processing precursors may be delivered. Because processing chambers may deliver corrosive or reactive precursors, components or piping through the system may include coatings to protect the materials from damage. Lid plate 205 may be a single-piece design in some embodiments, and may extend up to a meter or more in length, which may challenge coating chambers. Accordingly, some embodiments of the present technology may limit interaction between precursors and lid plate 205, such as with lid spacers and liners as previously described to protect interior surfaces, and by utilizing feedthroughs as illustrated.

Apertures 1405 extending through lid plate 205 may be sized to accommodate a feedthrough which may provide a channel for delivering precursors through the lid plate. The feedthroughs may be or include corrosion resistant materials, which may protect against damage from precursors being delivered, such as chlorine or fluorine-containing precursors. The materials may include any of the coatings or materials previously described, and may also include other corrosion resistant materials, such as steel, nickel, alloys, or other metals or materials that may be resistant to corrosion. The feedthroughs may extend through the lid plate completely, and may be piped with a split or otherwise coupled with each of the first gas block and second gas block as previously described. Depending on the number of precursors, multiple feedthroughs may extend through the lid plate and be coupled with each gas block, including the two feedthroughs and associated piping illustrated previously. The feedthroughs may be positioned through the lid plate and set with a jam nut and washers, such as belleville washers as illustrated, which may allow adjustable sealing of the feedthrough with a base plate sealing the feedthrough with the lid plate.

As previously explained, lid plate 205 may be hingedly coupled with the chamber body 305, which may separate feedthroughs 1315 from an associated piping path, although in some embodiments flexible and or retractable piping solutions may be incorporated. In some embodiments, feedthroughs 1315 may land on elastomeric elements 1410, such as o-rings, which may provide a sealing surface to receive feedthroughs when the lid plate is engaged with the chamber body. The gas feedthroughs may seat on the elastomeric elements 1410 when the lid plate is closed upon the chamber body, which may provide a seal between the components. By utilizing chamber systems and components according to embodiments of the present technology, component degradation and flaking may be reduced, and improved plasma processing may be afforded.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a plate" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing system comprising:
a pedestal configured to support a semiconductor substrate, the pedestal operable as a first plasma-generating electrode;
a lid plate defining a radial volume;
a faceplate supported with the lid plate, the faceplate operable as a second plasma-generating electrode, wherein a plasma processing region is defined between the pedestal and the faceplate within the radial volume defined by the lid plate, and wherein the faceplate defines a plurality of first apertures;
a showerhead positioned between the faceplate and the pedestal, wherein the showerhead defines a plurality of second apertures comprising a greater number of apertures than the plurality of first apertures;
an annular liner positioned within the radial volume defined by the lid plate, wherein the annular liner is characterized by a first surface facing the showerhead and a second surface opposite the first surface, wherein:
the annular liner defines a protrusion extending about an exterior surface of the annular liner; and
the protrusion is recessed from the first surface of the annular liner and defines a first ledge facing the first surface of the annular liner and a second ledge facing the second surface of the annular liner.

2. The semiconductor processing system of claim 1, wherein the showerhead comprises a dielectric material.

3. The semiconductor processing system of claim 1, wherein the showerhead defines at least twice as many apertures as the faceplate.

4. The semiconductor processing system of claim 1, wherein each aperture of the plurality of second apertures is offset from each aperture of the plurality of first apertures.

5. The semiconductor processing system of claim 4, wherein a first subset of apertures of the plurality of second apertures is characterized by a similar aperture pattern as the plurality of first apertures, and wherein each aperture of the first subset of apertures is offset from an associated aperture of the plurality of first apertures along an angle from a central axis through the showerhead.

6. The semiconductor processing system of claim 4, wherein a second subset of apertures of the plurality of second apertures is characterized by a similar aperture pattern as the plurality of first apertures, and wherein each aperture of the second subset of apertures is offset from an associated aperture of the plurality of first apertures along a radius from a central axis through the showerhead.

7. The semiconductor processing system of claim 1, further comprising:
a first elastomeric element extending about the first ledge, wherein the first elastomeric element extends proud of the first surface of the annular liner, and wherein the showerhead is seated on the first elastomeric element; and
a second elastomeric element extending about the second ledge.

8. The semiconductor processing system of claim 7, further comprising a spacer seated on the lid plate, the spacer defining a first recessed ledge, wherein the second elastomeric element is seated on the first recessed ledge of the spacer, and wherein the spacer defines a second recessed ledge radially outward of the first recessed ledge.

9. The semiconductor processing system of claim 8, wherein the showerhead defines a plurality of notches about an exterior edge of the showerhead, wherein the semiconductor processing system further comprises:
a plurality of alignment pins, each alignment pin of the plurality of alignment pins at least partially disposed within a notch of the plurality of notches, wherein each alignment pin of the plurality of alignment pins is seated on the second recessed ledge of the spacer.

10. A semiconductor processing system comprising:
a lid plate at least partially defining a radial volume for plasma processing;
a spacer seated on the lid plate and at least partially extending within the radial volume, the spacer characterized by a first surface and a second surface opposite the first surface, the spacer seated on the lid plate along the second surface of the spacer;
a faceplate seated on the first surface of the spacer and at least partially defining the radial volume from above, the faceplate defining a plurality of first apertures;
a gasbox, wherein the faceplate is disposed between the gasbox and the spacer, wherein the gasbox defines a central aperture, and wherein the gasbox defines a first channel within a first surface of the gasbox; and
a heater disposed within the first channel;
an annular liner positioned within the radial volume defined by the lid plate, wherein the annular liner is characterized by a first surface and a second surface opposite the first surface and that faces the faceplate, wherein:
the annular liner defines a protrusion extending about an exterior surface of the annular liner; and
the protrusion is recessed from the first surface of the annular liner and defines a first ledge facing the first surface of the annular liner and a second ledge facing the second surface of the annular liner.

11. The semiconductor processing system of claim 10, further comprising a cover plate extending across the first channel defined within the first surface of the gasbox.

12. The semiconductor processing system of claim 11, wherein the gasbox further defines:
a second channel within the first surface of the gasbox radially inward of the first channel, and a third channel within the first surface of the gasbox radially outward of the first channel, wherein the semiconductor processing system further comprises:

a first gasket disposed within the second channel within the first surface of the gasbox, and a second gasket disposed within the third channel within the first surface of the gasbox, wherein the cover plate forms a seal between the first gasket and the second gasket.

13. A semiconductor processing system comprising:

a lid plate defining a first radial volume and a second radial volume laterally separated along the lid plate from the first radial volume;

a first lid stack seated on the lid plate and axially aligned with the first radial volume;

a first RF match, wherein the first lid stack is disposed between the lid plate and the first RF match;

a second lid stack seated on the lid plate and axially aligned with the second radial volume, wherein the first lid stack comprises a first gasbox defining a central aperture, and wherein the second lid stack comprises a second gasbox defining a central aperture;

a first outlet manifold positioned on the first gasbox along a first surface of the first outlet manifold, wherein the first outlet manifold defines a central aperture extending partially through the first outlet manifold from the first surface of the first outlet manifold towards a second surface of the first outlet manifold opposite the first surface of the first outlet manifold, wherein the central aperture of the first outlet manifold provides fluid access to the central aperture of the first gasbox;

a first conductive pin electrically coupling the first RF match with the first outlet manifold;

a second outlet manifold positioned on the second gasbox along a first surface of the second outlet manifold, wherein the second outlet manifold defines a central aperture extending partially through the second outlet manifold from the first surface of the second outlet manifold towards a second surface of the second outlet manifold opposite the first surface of the first outlet manifold, wherein the central aperture of the second outlet manifold provides fluid access to the central aperture of the second gasbox;

a second RF match, wherein the second lid stack is disposed between the lid plate and the second RF match; and a second conductive pin electrically coupling the second RF match with the second outlet manifold.

14. The semiconductor processing system of claim 13, wherein the first gasbox and the second gasbox each define a first channel within a first surface of a respective gasbox on which a respective outlet manifold is positioned, wherein each first channel is characterized by a spiral profile within the first surface of the respective gasbox.

15. The semiconductor processing system of claim 14, further comprising:

a first heater extending through the first channel of the first gasbox, a first RF filter coupled with the first heater, a second heater extending through the first channel of the second gasbox, and a second RF filter coupled with the second heater.

16. The semiconductor processing system of claim 13, further comprising:

a first gas block coupled with an exterior edge of the first outlet manifold, wherein the first gas block is coupled to provide fluid communication to the central aperture of the first outlet manifold; and a second gas block coupled with an exterior edge of the second outlet manifold, wherein the second gas block is coupled to provide fluid communication to the central aperture of the second outlet manifold.

17. The semiconductor processing system of claim 16, further comprising a gas feedthrough extending through the lid plate and coupled with each of the first gas block and the second gas block.

18. The semiconductor processing system of claim 17, wherein the semiconductor processing system includes two gas feedthroughs extending through the lid plate and coupled with each of the first gas block and the second gas block, wherein the lid plate defines an aperture through which the gas feedthrough extends, wherein the lid plate is hingedly coupled with a chamber body of the semiconductor processing system, and wherein the chamber body comprises an elastomeric element on which the gas feedthrough seats when the lid plate is closed upon the chamber body.

* * * * *